(12) United States Patent
Fiorentino et al.

(10) Patent No.: US 11,944,965 B2
(45) Date of Patent: Apr. 2, 2024

(54) MICROFLUIDIC DEVICE

(71) Applicant: IMEC VZW, Leuven (BE)

(72) Inventors: Giuseppe Fiorentino, Etterbeek (BE); Simone Severi, Leuven (BE); Aurelie Humbert, Schaarbeek (BE)

(73) Assignee: Imec vzw, Leuven (BE)

( * ) Notice: Subject to any disclaimer, the term of this patent is extended or adjusted under 35 U.S.C. 154(b) by 803 days.

(21) Appl. No.: 16/880,247

(22) Filed: May 21, 2020

(65) Prior Publication Data
US 2020/0406255 A1  Dec. 31, 2020

(30) Foreign Application Priority Data

Jun. 28, 2019  (EP) .................................. 19183221

(51) Int. Cl.
*B81C 1/00* (2006.01)
*B01L 3/00* (2006.01)
*B29C 65/02* (2006.01)

(52) U.S. Cl.
CPC ... *B01L 3/502715* (2013.01); *B01L 3/502707* (2013.01); *B29C 65/02* (2013.01); *B81C 1/00119* (2013.01); *B01L 2200/10* (2013.01); *B01L 2300/0838* (2013.01); *B01L 2300/0887* (2013.01); *B81C 2201/013* (2013.01); *B81C 2203/03* (2013.01); *B81C 2203/031* (2013.01); *B81C 2203/036* (2013.01)

(58) Field of Classification Search
CPC ........... B81C 1/00119; B81C 2201/013; B81C 2203/03; B81C 2203/036
See application file for complete search history.

(56) References Cited

U.S. PATENT DOCUMENTS

| | | | |
|---|---|---|---|
| 7,943,491 B2* | 5/2011 | Nuzzo | H01L 29/0665 438/735 |
| 9,741,529 B2 | 8/2017 | Mele et al. | |
| 2010/0123457 A1* | 5/2010 | Shinoda | B03C 1/288 324/228 |
| 2010/0277722 A1* | 11/2010 | Kraiczek | B81C 1/00071 204/461 |

(Continued)

FOREIGN PATENT DOCUMENTS

WO    2009/029177 A1    3/2009

OTHER PUBLICATIONS

Majeed, B., et al., "Silicon Microfluidics: An Enabling Technology for Life Sciences Application", IMAPS 2017, 50th International Symposium on Microelectronics, Oct. 9-12, 2017, pp. 1-6.

(Continued)

*Primary Examiner* — Binh X Tran
(74) *Attorney, Agent, or Firm* — McDonnell Boehnen Hulbert & Berghoff LLP

(57) ABSTRACT

A microfluidic device, a diagnostic device including the microfluidic device and a method for making the microfluidic device are provided. The microfluidic device includes: (i) a transparent substrate comprising a cavity, the cavity opening up to a top of the transparent substrate; (ii) a transparent layer covering the cavity, and (iii) a semiconductor substrate over the transparent layer and the transparent substrate, wherein the semiconductor substrate comprises a through hole overlaying the cavity and exposing the transparent layer.

9 Claims, 6 Drawing Sheets

C

(56) References Cited

U.S. PATENT DOCUMENTS

2011/0134420 A1    6/2011  Matsumoto et al.
2013/0210639 A1    8/2013  Link et al.

OTHER PUBLICATIONS

Mele, L., et al., "Wafer-Level Assembly and Sealing of a MEMS Nanoreactor for in situ Microscopy", J. Micromech. Microeng., 2010, vol. 20(8), pp. 1-9.

Sobek, D., et al., "A Microfabricated Flow Chamber for Optical Measurements in Fluids", Proceedings of the Workshop on Micro Electro Mechanical Systems (MEMS), Fort Lauderdale, Feb. 7-10, 1993, vol. Workshop 6, pp. 219-224.

Verpoorte, E., et al., "Microfluidics Meets MEMS", Proceedings of the IEEE, Jun. 2003, vol. 91(6), pp. 930-953.

Extended European Search Report, for Application No. 19183221.1, dated Nov. 9, 2019, pp. 1-9.

\* cited by examiner

MICROFLUIDIC DEVICE

CROSS-REFERENCE

This application claims priority based on European Patent Application no. 19183221.1, filed on Jun. 28, 2019, which is incorporated by reference in it entirety.

TECHNICAL FIELD OF THE DISCLOSURE

The present disclosure relates to microfluidic devices and in particular to microfluidic devices based on semiconductor substrates.

BACKGROUND OF THE DISCLOSURE

In recent years, interest in reliable and low-cost lab-on-a-chip devices has grown rapidly. Indeed, it can be a very attractive scenario for both point-of-care applications and conventional laboratories to be able to perform on a single chip a set of actions traditionally requiring many different tools. In particular, microfluidic devices are nowadays a key component of glucose sensors, drug delivery systems as well as cell analysis modules. These devices can often be realized by creating a set of microfluidic structures on a cheap substrate, e.g. plastic. The fluid can then be driven into the system by a pump and, after a series of defined operation, analysed in an imaging chamber. Depending on the analysis technique being performed, the imaging chamber typically needs to meet particular requirements, such as being transparent to visible wavelengths. As such, it may usually not be integrated on-chip, but may rather be provided separately (i.e. off-chip).

However, in order to achieve compact and cheap systems for the point-of-care market, there may be an increasing demand to remove the pump and to integrate the imaging chamber on-chip. One may omit the pump by moving to capillary microfluidics, but this can be non-trivial in plastic substrates due to intrinsic material properties and tools limitations. For example, it can be difficult to achieve a constant and uniform contact angle therein, especially if the plastic capillaries are functionalized.

Recent results on silicon substrates indicate a much better reproducibility of the capillary microfluidics than for plastics. Silicon furthermore can provide higher precision and manufacturability, thanks to the use the well-developed conventional CMOS techniques and production lines. On the other hand, silicon has a considerably higher cost per $mm^2$. Furthermore, as an inherently non-transparent material, it faces the challenge of how to integrate a transparent imaging chamber thereon.

Verpoorte and De Rooij reviewed different microfluidic device architectures, including devices in which microfluidic channels are made in silicon and sealed using a glass cover chip (VERPOORTE, Elisabeth; DE ROOIJ, NICO F. Microfluidics meets MEMS. *Proceedings of the IEEE*, 2003, 91.6: 930-953.). However, this only allows light to pass into or out of one face of the device, not through the device, thereby severely limiting the analytical techniques that can be used.

There is thus still a need in the art for microfluidic devices which address some or all of the issues outlined above.

SUMMARY OF THE DISCLOSURE

It is an object of the present disclosure to provide good microfluidic devices based on semiconductor substrates. It is a further object of the present disclosure to provide good methods for making such a microfluidic device and good products associated therewith. This objective can be accomplished by devices and a method according to the present disclosure.

In some embodiments of the present disclosure, the cavity can be well sealed from the outside environment while still allowing light to pass therethrough. In some embodiments of the present disclosure, the cavity can be used as a sample chamber (e.g. an imaging chamber). It is yet other embodiments of the present disclosure, the sample chamber can be integrated on-chip.

In some of embodiments of the present disclosure, the dimensions of the cavity can be well controlled.

In some embodiments of the present disclosure, the microfluidic channels can be formed in a semiconductor substrate. In some embodiments, these microfluidic channels can be formed in a well-defined and reproducible manner, e.g. using well-developed and -established CMOS processing techniques. In some embodiments of the present disclosure, the surface of the microfluidic channels can be functionalized without impairing the microfluidic properties of said channel.

In some embodiments of the present disclosure, the microfluidic device does not require a pump, but that it can e.g. operate based on capillary microfluidics.

In some embodiments of the present disclosure, the microfluidic device can be made using materials and techniques which may be widely available.

In some embodiments of the present disclosure, the microfluidic device can be made with a relatively small device footprint, thereby reducing material costs.

It some embodiments of the present disclosure, the microfluidic device can be made in a relatively straightforward and economical fashion.

In a first aspect, the present disclosure relates to a microfluidic device, comprising: (i) a transparent substrate comprising a cavity, the cavity opening up to a top of the transparent substrate, (ii) a transparent layer covering the cavity, and (iii) a semiconductor substrate over the transparent layer and the transparent substrate, wherein the semiconductor substrate comprises a through hole overlaying the cavity and exposing the transparent layer.

In a second aspect, the present disclosure relates to a diagnostic device (e.g. a point-of-care device) comprising the microfluidic device according to any embodiment of the first aspect.

In a third aspect, the present disclosure relates to a method for making a microfluidic device according to any embodiment of the first aspect, comprising: (a) providing a transparent substrate comprising a cavity, the cavity opening up to a top of the transparent substrate; (b) providing a semiconductor substrate; (c) forming a transparent layer for covering the cavity over the semiconductor substrate or over the transparent substrate; (d) bonding the transparent substrate to the semiconductor substrate in such a way that the transparent layer is present between the semiconductor substrate and the transparent substrate and covers the cavity; and (e) etching a through hole through the semiconductor substrate to expose the transparent layer over the cavity.

Particular aspects of the disclosure are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable and reliable devices of this nature.

The above and other characteristics, features and benefits of the present disclosure will become apparent from the following detailed description, taken in conjunction with the accompanying drawings, which illustrate, by way of example, the principles of the disclosure. This description is given for the sake of example only, without limiting the scope of the disclosure. The reference figures quoted below refer to the attached drawings.

Figure 1:
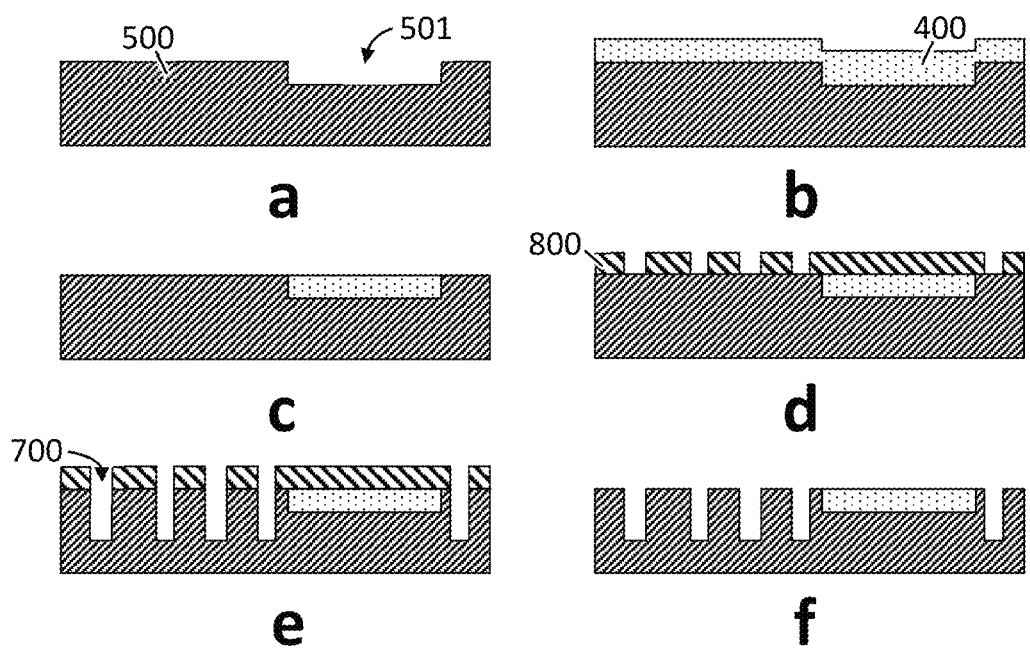
FIG. 1, parts a-f, schematically depicts different steps in a first exemplary method of forming a microfluidic device according to embodiments of the present disclosure.

In the different figures, the same reference signs refer to the same or analogous elements.

DETAILED DESCRIPTION OF THE DISCLOSURE

The present disclosure will be described with respect to particular embodiments and with reference to certain drawings but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the disclosure.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosure described herein are capable of operation in other sequences than described or illustrated herein.

Moreover, the terms top, over and the like in the description and the claims are used for descriptive purposes and not necessarily for describing relative positions. It is to be understood that the terms so used are interchangeable with their antonyms under appropriate circumstances and that the embodiments of the disclosure described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. The term "comprising" therefore covers the situation where only the stated features are present and the situation where these features and one or more other features are present. Thus, the scope of the expression "a device comprising means A and B" should not be interpreted as being limited to devices consisting only of components A and B. It means that with respect to the present disclosure, the only relevant components of the device are A and B.

Similarly, it is to be noticed that the term "coupled", also used in the claims, should not be interpreted as being restricted to direct connections only. The terms "coupled" and "connected", along with their derivatives, may be used. It should be understood that these terms are not intended as synonyms for each other. Thus, the scope of the expression "a device A coupled to a device B" should not be limited to devices or systems wherein an output of device A is directly connected to an input of device B. It means that there exists a path between an output of A and an input of B which may be a path including other devices or means. "Coupled" may mean that two or more elements are either in direct physical or electrical contact, or that two or more elements are not in direct contact with each other but yet still co-operate or interact with each other.

Reference throughout this specification to "one embodiment" or "an embodiment" means that a particular feature, structure or characteristic described in connection with the embodiment is included in at least one embodiment of the present disclosure. Thus, appearances of the phrases "in one embodiment" or "in an embodiment" in various places throughout this specification may not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the disclosure, various features of the disclosure are sometimes grouped together in a single embodiment, figure, or description thereof for the purpose of streamlining the disclosure and aiding in the understanding of one or more of the various disclosed aspects. This method of disclosure, however, is not to be interpreted as reflecting an intention that the claimed disclosure requires more features than are expressly recited in each claim. Rather, as the following claims reflect, disclosed aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

In the description provided herein, numerous specific details are set forth. However, it is understood that embodiments of the disclosure may be practiced without these specific details. In other instances, well-known methods, structures, and techniques have not been shown in detail in order not to obscure an understanding of this description.

The following terms are provided solely to aid in the understanding of the disclosure.

As used herein, and unless otherwise specified, a 'transparent' or 'optically transparent' material is a material which has a transmittance of at least 50%, at least 70%, at least 80%, usually at least 90%. The transparent material preferably allows light to pass through the material without being scattered; in other words: it follows Snell's law (in contrast to translucent materials). In embodiments, the transparent material may be transparent to at least a portion of visible light and/or infrared light and/or UV light.

As used herein, and unless otherwise specified, a glass is a non-crystalline, amorphous solid that exhibits a glass transition when heated towards the liquid state.

As used herein, and unless otherwise specified, a cavity may typically have a width, a length and a height. In embodiments, these three dimensions may typically be perpendicular. In embodiments, the height may be the dimension perpendicular to the transparent substrate. In embodiments, the width may be equal to or shorter than the length.

In a first aspect, the present disclosure relates to a microfluidic device, comprising: (i) a transparent substrate comprising a cavity, the cavity opening up to a top of the transparent substrate, (ii) a transparent layer covering the cavity, and (iii) a semiconductor substrate over the transparent layer and the transparent substrate, wherein the semiconductor substrate comprises a through hole overlaying the cavity and exposing the transparent layer.

In embodiments, the semiconductor substrate may comprise (e.g. consist of) silicon.

In embodiments, the transparent substrate may comprise (e.g. consist of) glass. In embodiments, the transparent substrate may comprise (e.g. consist of) silicate glass (e.g. fused quartz), borosilicate glass or soda-lime glass. In embodiments, the transparent substrate may be doped (e.g. with alkali dopants). Such dopants can facilitate bonding (e.g. anodic bonding) of the transparent substrate to the semiconductor substrate.

The semiconductor substrate may be over the transparent layer and the transparent substrate in such a way that the transparent layer may be between the semiconductor substrate and the transparent layer. Typically, the transparent layer may be both on the transparent substrate and on the semiconductor substrate.

In embodiments, the transparent layer may be a dielectric layer. In embodiments, the transparent layer may comprise (e.g. consist of) a polymer, a silicon nitride (e.g. $Si_3N_4$) or a silicon oxide (e.g. $Si_xO_y$, such as $SiO_2$). The transparent layer may be a different entity than the transparent substrate, i.e. it is not a part of the transparent substrate. The transparent layer covers the cavity. Typically, the transparent layer closes the opening of the cavity. In embodiments, the silicon nitride may be deposited by chemical vapour deposition (CVD); e.g. plasma-enhanced CVD (PECVD) or low-pressure CVD (LPCVD). In embodiments, the silicon oxide may be deposited by chemical vapour deposition (e.g. PECVD or LPCVD) or can be formed by thermal oxidation.

In embodiments, the microfluidic device may comprise a microfluidic channel fluidically coupled to the cavity. In embodiments, the microfluidic channel may be a capillary microfluidic channel. In embodiments, the microfluidic channel may be at least partially defined in the semiconductor substrate. In embodiments, the microfluidic channel may comprise a step (e.g. the microfluidic channel may have a width which changes from a first value to a second value in a discontinuous manner). In embodiments, the microfluidic channel may be for transporting and/or processing (e.g. routing, splitting, mixing or lysing) a sample. In embodiments, the sample may be a chemical, biochemical, biological or medical specimen. In embodiments, the microfluidic device may comprise an inlet and/or an outlet fluidically coupled (e.g. through the microfluidic channel) to the cavity. The inlet, microfluidic channel and outlet can beneficially allow introduction of a sample into the microfluidic device, transporting the sample to the cavity (and optionally process it alongside) and retrieving the sample from the device.

In embodiments, the cavity may have a height of from 100 nm to 100 μm, usually from 1 to 10 μm. In embodiments, the cavity may have a width and/or length of from 100 nm to 100 μm, usually from 1 to 10 μm. In embodiments, the cavity may be a sample chamber for analysing an analyte in the cavity. In embodiments, analysing may be by an optical (e.g. spectroscopic or microscopic) technique, such as optical microscopy or holography. In some embodiments, the cavity may be an imaging chamber for imaging an analyte in the cavity. The optical technique typically operates using light of a particular wavelength or wavelength range and the transparent layer and transparent substrate may be typically selected such that they are transparent for this particular wavelength or wavelength range.

In embodiments, the semiconductor substrate may comprise a surface functionalization. In embodiments, the microfluidic channel defined in the semiconductor substrate may comprise the surface functionalization. In embodiments, the surface functionalization may comprise a non-fluorescent compound or a magnetic material. The microfluidic channel may, for example, be functionalized in order to improve the microfluidic properties thereof, or to enable or enhance an analysing or separating function thereof (e.g. using a magnetic material). In other embodiments, the through hole may comprise the surface functionalization. The through hole may, for example, be functionalized with a material (e.g. a low-reflectance and/or non-fluorescent coating) to facilitate using an optical technique on the cavity with no or minimal interference.

In a second aspect, the present disclosure relates to a diagnostic device comprising the microfluidic device according to any embodiment of the first aspect.

In embodiments, any feature of any embodiment of the second aspect may independently be as correspondingly described for any embodiment of any of the other aspects.

In a third aspect, the present disclosure relates to a method for making a microfluidic device according to any embodiment of the first aspect, comprising: (a) providing a transparent substrate comprising a cavity, the cavity opening up to a top of the transparent substrate; (b) providing a semiconductor substrate; (c) forming a transparent layer for covering the cavity over the semiconductor substrate or over the transparent substrate; (d) bonding the transparent substrate to the semiconductor substrate in such a way that the transparent layer is present between the semiconductor substrate and the transparent substrate and covers the cavity; and (e) etching a through hole through the semiconductor substrate to expose the transparent layer over the cavity.

In embodiments, in step a, one face of the transparent substrate may be opaque due to the presence of an opacifying layer. This may be helpful to facilitate handling the transparent substrate by conventional clean room tools. The side of the transparent layer which is processed, i.e. the side comprising the opening, may be the side opposite to the opacified layer. The opacifying layer can be removed after the bonding step d, e.g. by a dry plasma clean, in order to recover the transparency of the substrate.

Step c comprises forming a transparent layer for covering the cavity over the semiconductor substrate or over the transparent substrate. This means that the transparent layer may cover the cavity and that the transparent layer may be formed over the semiconductor substrate or over the transparent substrate.

In some embodiments, step c may comprise forming the transparent layer over the semiconductor substrate. Different examples thereof may be provided for example in Examples 1-4. In other embodiments, step c may comprise forming the transparent layer over the transparent substrate. For example, a polymer layer (e.g. a photopatternable polymer, such as SU-8 or polydimethylsiloxane, PDMS.) can be laminated directly on top of a transparent substrate (e.g. glass). In some embodiments, it may be beneficial to form the transparent layer in such a way that it has low tensile stress. In embodiments, step c may comprise a plasma-enhanced chemical vapour deposition (PECVD).

In embodiments, step c may comprise patterning the transparent layer. In embodiments, patterning the transparent layer may comprise a photolithography, e-beam lithography or another lithographic technique.

In embodiments, step c may comprise transferring the transparent layer from an auxiliary substrate to the semiconductor substrate or the transparent substrate. In embodiments, transferring the transparent layer may comprise bonding the auxiliary substrate to the semiconductor substrate and thinning the auxiliary substrate until it is removed. The bonding of the auxiliary substrate to the semiconductor substrate can be performed so that the transparent layer lies in between the auxiliary substrate and the semiconductor substrate.

In embodiments, the transparent layer present on the auxiliary substrate may be a relaxed layer (i.e. a layer which is not strained). This can beneficially allow it to better survive the subsequent transfer.

In embodiments, step c may comprise forming a microfluidic channel in the semiconductor substrate. In embodiments, forming the microfluidic channel may comprise etching the semiconductor substrate. In embodiments, forming the microfluidic channel may further comprise etching the semiconductor substrate as second time. In embodiments, etching the semiconductor substrate (e.g. the first or the second time) may comprise providing a patterned masking layer (e.g. a hard mask layer) over the semiconductor substrate and transferring the pattern into the semiconductor substrate. In embodiments, etching the semiconductor substrate a second time may comprise conformally providing a further masking layer (e.g. a second hard mask layer) over the semiconductor substrate and the patterned masking layer, selectively removing the further masking layer from top surfaces of the semiconductor substrate and the patterned masking layer with respect to sidewalls thereof (e.g. using a directional etch) and etching the semiconductor substrate selectively with respect to the masking layer and further masking layer.

In embodiments, step d may comprise an anodic bonding or a fusion bonding; usually anodic bonding. Anodic bonding can have some benefits compared to polymer bonding or fusion bonding in that there may be no risk of reflow into the channels (as is the case with polymer bonding) and leaves less bonding voids in areas with a high density of small features (where the bonding wave in fusion bonding cannot propagate well and therefore does not bond well). As such, anodic bonding can beneficially allows to significantly reduce the pitch between adjacent channels, thereby scaling down the total footprint and thus the final chip price.

In embodiments, the semiconductor substrate may comprise a microfluidic channel and step d may comprise bonding the semiconductor substrate to the transparent layer in such a way that the microfluidic channel is fluidically coupled to the cavity. In embodiments, bonding the semiconductor substrate to the transparent layer in such a way that the microfluidic channel can be fluidically coupled to the cavity may comprise aligning the microfluidic channel to a channel or opening in the transparent layer.

In embodiments, any feature of any embodiment of the third aspect may independently be as correspondingly described for any embodiment of any of the other aspects.

The disclosure will now be described by a detailed description of several embodiments of the disclosure. It is clear that other embodiments of the disclosure can be configured according to the knowledge of the person skilled in the art without departing from the true technical teaching of the disclosure, the disclosure being limited only by the terms of the appended claims.

EXAMPLE 1

In a first exemplary integration flow for fabricating a microfluidic device according to the present disclosure, a semiconductor substrate (e.g. Si wafer), comprising a transparent layer (e.g. dielectric) thereon, and a transparent substrate (e.g. glass or quartz), comprising a cavity, can first processed separately and subsequently assembled together.

Processing of the Semiconductor Substrate

We now refer to FIG. 1, parts a-f. An opening (501) can be first etched into the semiconductor substrate (500) using a conventional deep reactive-ion etching (DRIE) process (FIG. 1, part a). This etched opening (501) can be filled with a 1-10 μm thick transparent layer (400) (FIG. 1, part b), e.g. using a plasma-enhanced chemical vapour deposition (PECVD), and subsequently planarized to achieve a flat surface (FIG. 1, part c).

Microfluidic channels (700) (e.g. capillary microfluidic channels) can optionally be patterned into the semiconductor substrate (500). To this end, a single etch process can be used, in which a resist layer (800) is first deposited over the semiconductor substrate (500) and patterned (FIG. 1, part d). The pattern can then be transferred into the semiconductor substrate (500) using a conventional DRIE process to form the microfluidic channels (700) therein (FIG. 1, part e); after which the resist layer (800) is removed (FIG. 1, part f). Alternatively, a multiple etch process can be used, e.g. as described by Majeed et al. (MAJEED, Bivragh, et al. Silicon microfluidics: An enabling technology for life sciences application. In: International Symposium on Microelectronics. International Microelectronics Assembly and Packaging Society, 2017. p. 000188-000193.), which is incorporated herein by reference.

Processing of the Transparent Substrate

Optionally, one face of the transparent substrate may first be made opaque by depositing a layer stack thereon (not depicted). This can be helpful to facilitate handling the transparent substrate by conventional clean room tools. Once this stack is deposited, the wafers can be flipped and the front side can be processed as described below. This layer stack can be removed later in the process, e.g. by a dry plasma clean at the end, in order to recover the transparency of the substrate.

Figure 2:
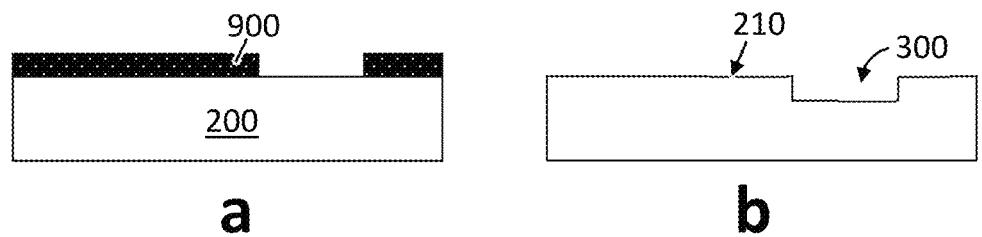
FIG. 2, parts a and b, schematically depicts different steps in a first exemplary method of forming a microfluidic device according to embodiments of the present disclosure.

We now refer to FIG. 2, parts a-b. In a first approach, a cavity (300) can be formed into a top (210) of the transparent substrate (200) by depositing a hard mask layer (900) (e.g. amorphous Si) onto the transparent substrate (200), providing a resist layer (800) thereon, patterning the resist layer (800) using conventional i-line lithography and transferring the pattern into the hard mask layer (900) (FIG. 2, part a). The transparent substrate (200) can be subsequently etched using a combination of dry and wet processes; this allows, if desired, deep etches of 10 µm or more. Once etched, the resist layer (800) can be removed by means of a wet process (e.g. based on tetramethylammoniumhydroxide, TMAOH; or KOH) (FIG. 2, part b).

Figure 3:
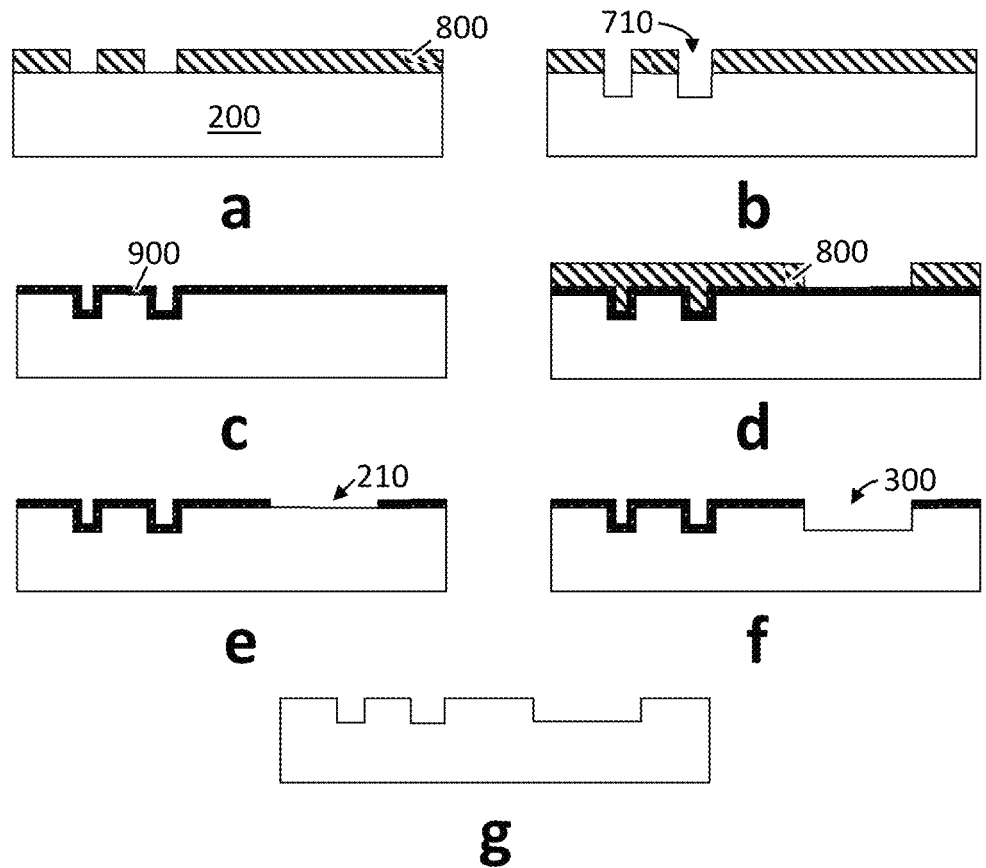
FIG. 3, parts a-f, schematically depicts different steps in a first exemplary method of forming a microfluidic device according to embodiments of the present disclosure.

We now refer to FIG. 3, parts a-f. Alternatively, one or more fluidic channels (710) (e.g. microfluidic channels) can first be realized in the transparent substrate (200) by means of a resist layer (800) as masking material, patterning the resist layer (800) (FIG. 3, part a) and transferring the pattern into the transparent substrate (200) using conventional etch tools (FIG. 3, part b). After this initial patterning, the first resist layer (800) can be removed and the processing can be continued as in the previous approach (FIG. 3, parts c-f).

Assembling the Semiconductor and Transparent Substrate

Figure 4:
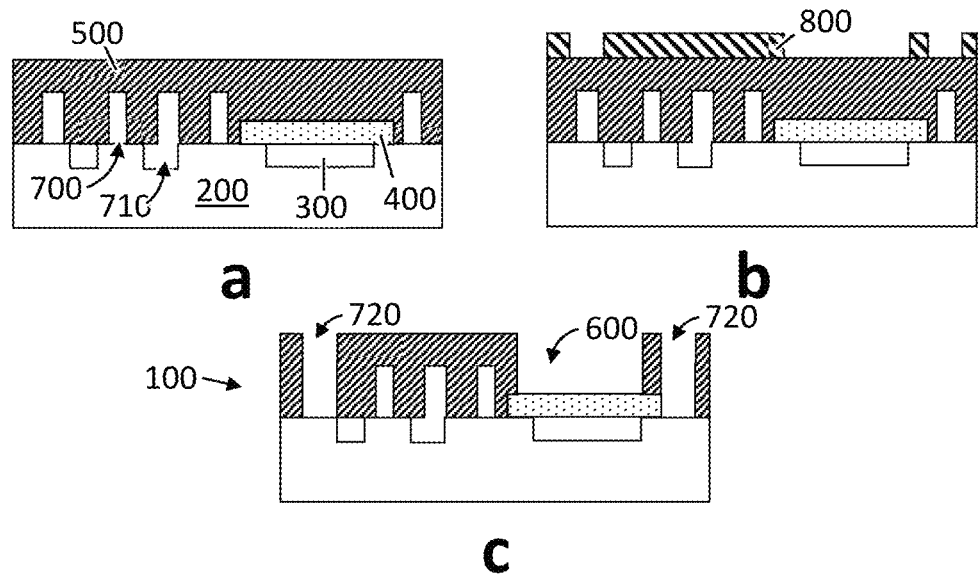
FIG. 4, parts a-c, schematically depicts different steps in a first exemplary method of forming a microfluidic device according to embodiments of the present disclosure.

We now refer to FIG. 4, parts a-c. The semiconductor substrate (500) and transparent substrate (200) can be bonded together (e.g. by fusion bonding). Optionally one or both of the substrates, e.g. the transparent substrate (200), can be thinned down using conventional grinding in order to reduce the device thickness. A conventional litho-etch process can be further used to open a through hole (600) above the transparent layer (400), thereby allowing light to pass to the cavity (300) and through the device. This can, for example, comprise depositing and patterning a resist layer (800) onto semiconductor substrate (500) (FIG. 4, part a), and then transferring the pattern into the semiconductor substrate (500) (FIG. 4, part b). Simultaneously, the litho-etch process can for instance be used to form access in- and/or outlets (720) for the microfluidic device (100). After a final dry plasma clean, the device (100) may then ready for dicing.

EXAMPLE 2

In a second exemplary integration flow for fabricating a microfluidic device according to the present disclosure, Example 1 can be repeated but the semiconductor substrate can be processed in an alternative way.

Processing of the Semiconductor Substrate

Figure 5:
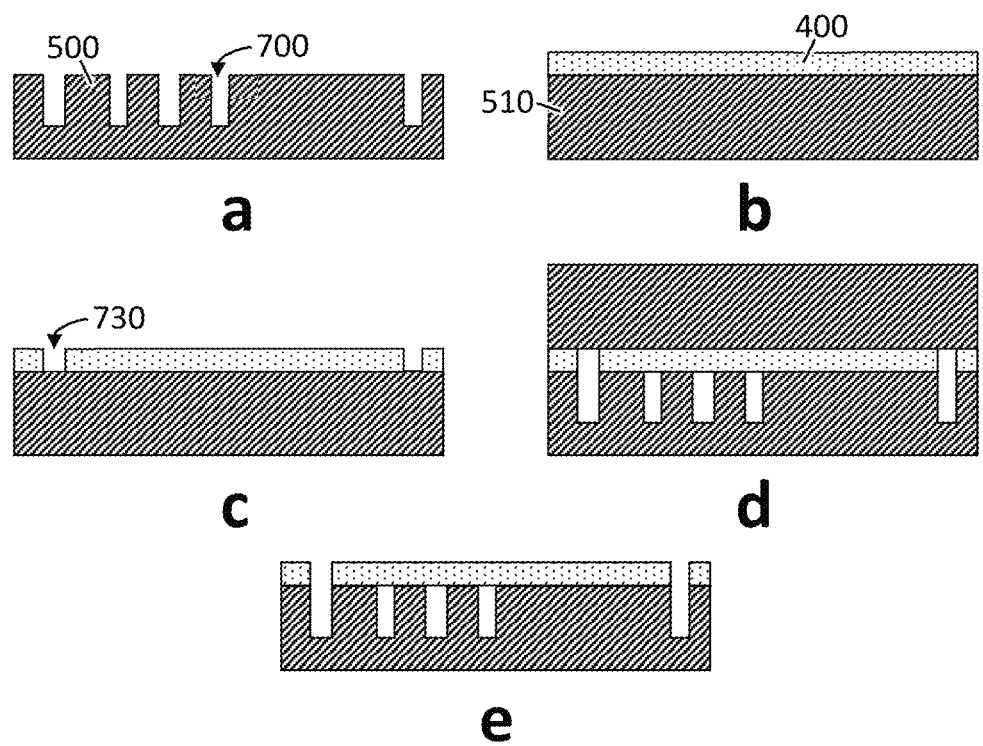
FIG. 5, parts a-e, schematically depicts different steps in a second exemplary method of forming a microfluidic device according to embodiments of the present disclosure.

We now refer to FIG. 5, parts a-e. Microfluidic channels (700) (e.g. capillary microfluidic channels (700)) can be first patterned into a semiconductor substrate (500) (FIG. 5, part a); for example, using the single etch process as described in Example 1 with reference to FIG. 1, parts d-f or the multiple etch process as e.g. described by Majeed et al.

On an auxiliary semiconductor substrate (510), a 1-10 µm thick transparent layer (400) (usually a low tensile stress layer, so as to better support the subsequent transfer) can be deposited (FIG. 5, part b) and connection holes and/or channels (730) can be patterned therein using conventional etch processes (FIG. 5, part c).

The transparent layer (400) can then be transferred to the semiconductor substrate (500) by bonding the semiconductor substrate (500) and the auxiliary semiconductor substrate (510) together (FIG. 5, part d; e.g. by fusion bonding) and entirely thinning down the auxiliary semiconductor substrate (510) using conventional grinding, thereby leaving only the transparent layer (400) on the semiconductor substrate (500) (FIG. 5, part e).

Processing of the Transparent Substrate

The transparent substrate (200) is prepared as described in Example 1.

Assembling the Semiconductor and Transparent Substrate

Figure 6:
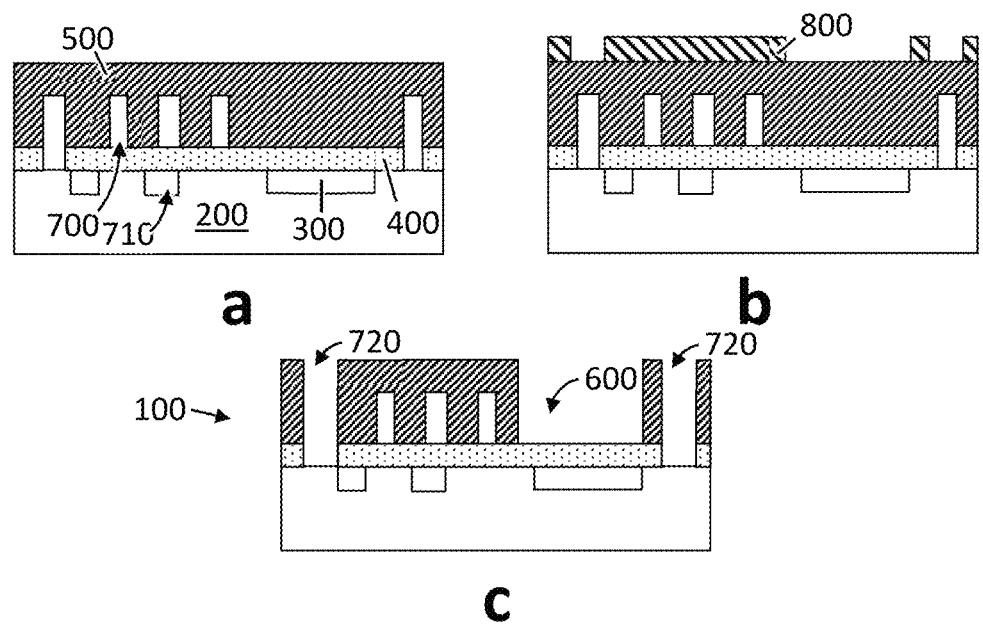
FIG. 6, parts a-c, schematically depicts different steps in a second exemplary method of forming a microfluidic device according to embodiments of the present disclosure.

We now refer to FIG. 6, parts a-c. The semiconductor substrate (500) and transparent substrate (200) can be bonded together in the same way as described in Example 1.

EXAMPLE 3

In a third exemplary integration flow for fabricating a microfluidic device according to the present disclosure, Example 1 is repeated but the semiconductor substrate is processed in yet another way.

Processing of the Semiconductor Substrate

Figure 7:
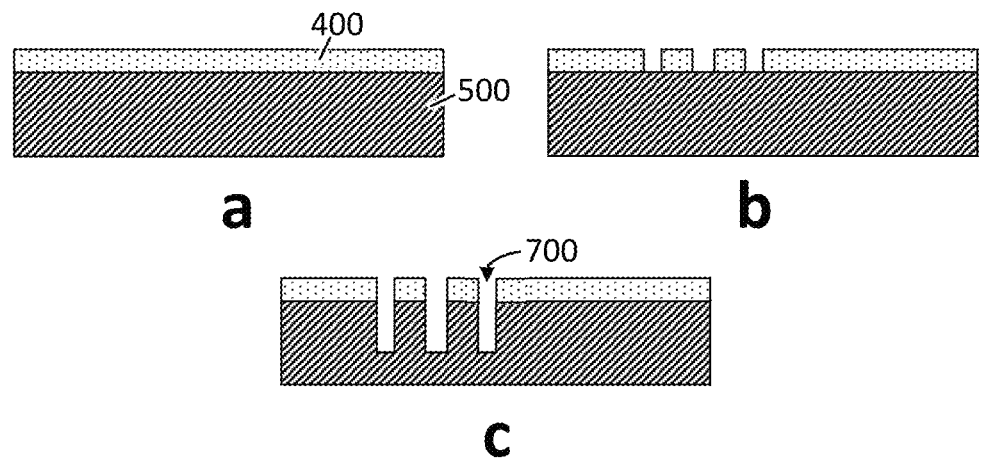
FIG. 7, parts a-c, schematically depicts different steps in a third exemplary method of forming a microfluidic device according to embodiments of the present disclosure.

We now refer to FIG. 7, parts a-c. A 1-10 µm thick transparent layer (400) is deposited (FIG. 7, part a) on a semiconductor substrate (500). Microfluidic channels (700) (e.g. capillary microfluidic channels) can then patterned into the transparent layer (400) (FIG. 7, part b) and first semiconductor substrate (500) (FIG. 7, part c); for example, using the single etch process as described in Example 1 with reference to FIG. 1, parts d-f or the multiple etch process as e.g. described by Majeed et al.

Processing of the Transparent Substrate

The transparent substrate (200) is prepared as described in Example 1.

Assembling the Semiconductor and Transparent Substrate

Figure 8:
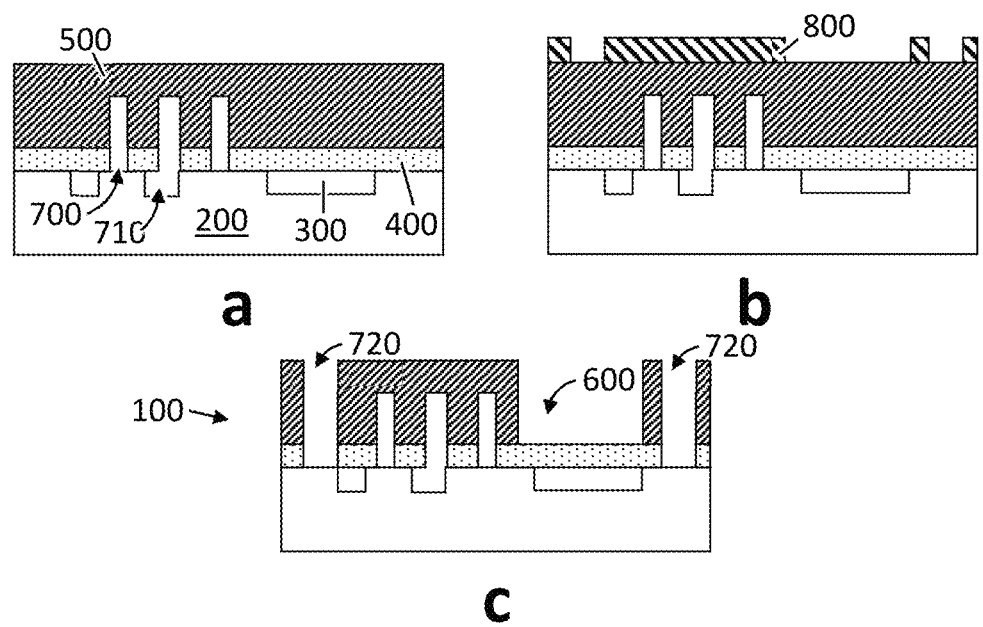
FIG. 8, parts a-c, schematically depicts different steps in a third exemplary method of forming a microfluidic device according to embodiments of the present disclosure.

We now refer to FIG. 8, parts a-c. The semiconductor substrate (500) and transparent substrate (200) can be bonded together in the same way as described in Example 1.

EXAMPLE 4

In a fourth exemplary integration flow for fabricating a microfluidic device according to the present disclosure, Example 1 may be repeated but the semiconductor substrate may be processed in still another way.

Processing of the Semiconductor Substrate

Figure 9:
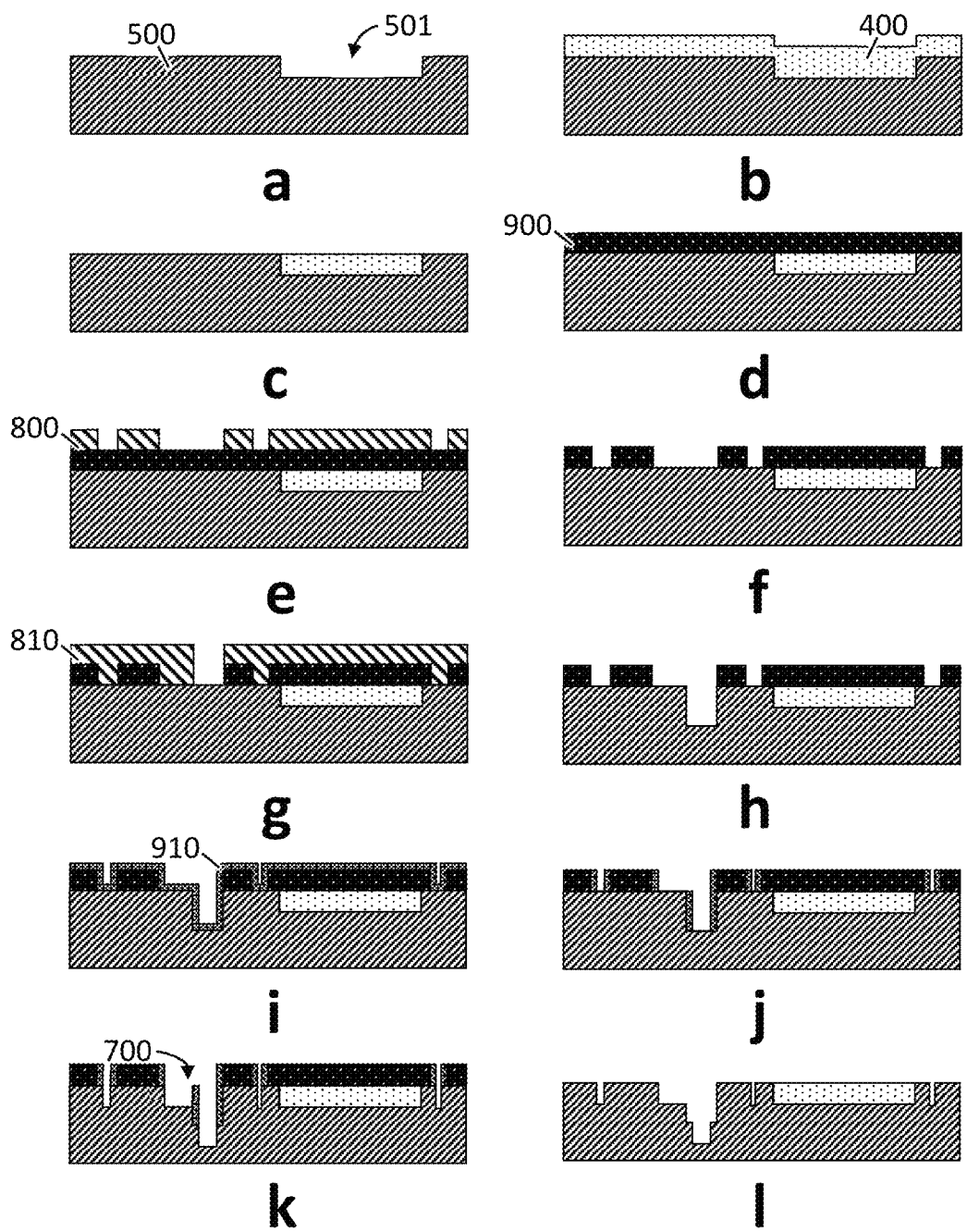
FIG. 9, parts a-l, schematically depicts different steps in a fourth exemplary method of forming a microfluidic device according to embodiments of the present disclosure.

We now refer to FIG. 9, parts a-l. An opening (501) is first etched into the semiconductor substrate (500) using a conventional DRIE process (FIG. 9, part a). This etched opening (501) can be filled with a 1-10 µm thick transparent layer (400) (FIG. 9, part b), e.g. using PECVD, and subsequently planarized to achieve a flat surface (FIG. 9, part c). The semiconductor substrate (500) can then be etched using a double etch process. To this end, a first hard mask layer (900) can be first deposited onto the semiconductor substrate (500) (FIG. 9, part d). Next, a first resist layer (800) can be deposited and patterned (FIG. 9, part e); after which the pattern can be transferred into the first hard mask layer (900) and the first resist layer (800) can be removed (FIG. 9, part f). A second resist layer (810) can then be deposited and patterned (FIG. 9, part g); after which the pattern thereof can be transferred into the semiconductor substrate (500) and the second resist layer (810) can be removed (FIG. 9, part h). Subsequently, a second hard mask layer (910) can be conformally deposited on the semiconductor substrate (500) and on the first hard mask layer (900) (FIG. 9, part i). Using a directional etch, the conformal second hard mask layer (910) can then be removed only on the top surfaces of the semiconductor substrate (500) and first hard mask layer (900), leaving it on the sidewalls (FIG. 9, part j). A second etch of the semiconductor substrate (500) can then be performed, selectively with respect to the hard mask layer (900) and the remainder of the second hard mask layer (910), thereby forming a microfluidic channel (700) (e.g. a capillary microfluidic channel) with a step (FIG. 9, part k). Finally, the hard mask layer (900) and second hard mask layer (910) are removed (FIG. 9, part l).

Processing of the Transparent Substrate

The transparent substrate (200) is prepared as described in Example 1.

Assembling the Semiconductor and Transparent Substrate

Figure 10:
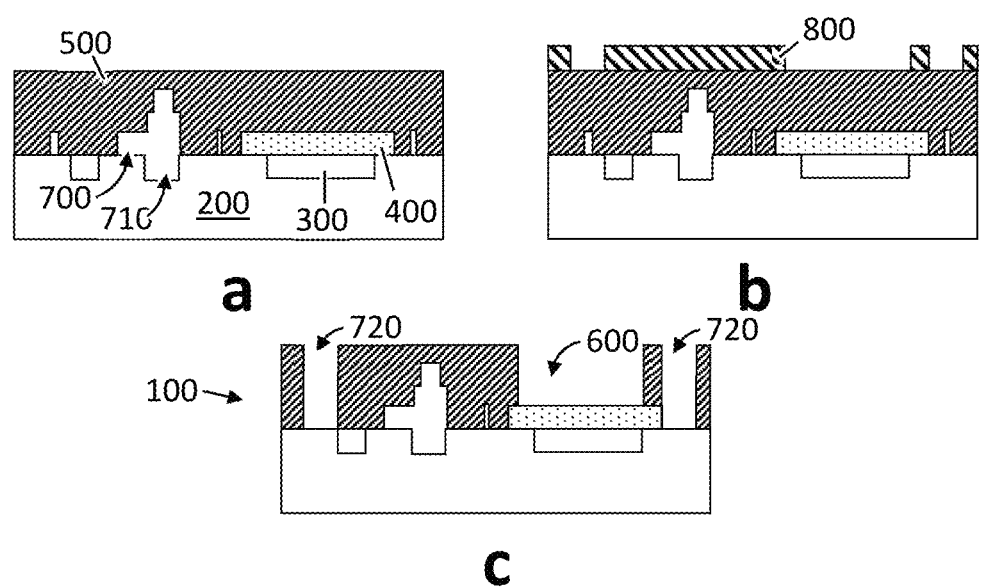
FIG. 10, parts a-c, schematically depicts different steps in a fourth exemplary method of forming a microfluidic device according to embodiments of the present disclosure.

We now refer to FIG. 10, parts a-c. The semiconductor substrate (500) and transparent substrate (200) can be bonded together in the same way as described in Example 1.

It is to be understood that although some embodiments, specific constructions and configurations, as well as materials, have been discussed herein for devices according to the present disclosure, various changes or modifications in form and detail may be made without departing from the scope and technical teachings of this disclosure. For example, any formulas given above may be merely representative of procedures that may be used. Functionality may be added or deleted from the block diagrams and operations may be interchanged among functional blocks. Steps may be added or deleted to methods described within the scope of the present disclosure.

The invention claimed is:

1. A method for making a microfluidic device, the method comprising:
   (a) providing a transparent substrate comprising a cavity, the cavity opening up to a top of the transparent substrate;
   (b) providing a semiconductor substrate;
   (c) forming, over the transparent substrate, a transparent layer covering the cavity;
   (d) after step (c), bonding the transparent substrate to the semiconductor substrate by anodic bonding in such a way that the transparent layer is present between the semiconductor substrate and the transparent substrate; and
   (e) etching a through hole through the semiconductor substrate to expose the transparent layer covering the cavity.

2. The method according to claim 1, wherein step c comprises patterning the transparent layer.

3. The method according to claim 1, wherein step (c) comprises transferring the transparent layer from an auxiliary substrate to the transparent substrate.

4. The method according to claim 1, wherein the semiconductor substrate comprises a microfluidic channel and wherein step d comprises bonding the semiconductor substrate to the transparent layer in such a way that the microfluidic channel is fluidically coupled to the cavity.

5. The method according to claim 1, wherein the semiconductor substrate comprises silicon.

6. The method according to claim 1, wherein the transparent substrate comprises glass.

7. The method according to claim 1, wherein the transparent layer comprises a polymer, a silicon nitride or a silicon oxide.

8. The method according to claim 1, wherein the microfluidic device comprises a microfluidic channel fluidically coupled to the cavity.

9. The method according to claim 8, wherein the microfluidic channel is a capillary microfluidic channel.

* * * * *